United States Patent
Aoki et al.

(10) Patent No.: US 8,431,941 B2
(45) Date of Patent: Apr. 30, 2013

(54) ACTIVE MATRIX SUBSTRATE, ELECTROPHORETIC DISPLAY APPARATUS, AND ELECTRONIC DEVICE

(75) Inventors: Takashi Aoki, Suwa (JP); Kazuya Nakamura, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 197 days.

(21) Appl. No.: 12/648,418

(22) Filed: Dec. 29, 2009

(65) Prior Publication Data
US 2010/0171129 A1 Jul. 8, 2010

(30) Foreign Application Priority Data

Jan. 7, 2009 (JP) .................................. 2009-001533

(51) Int. Cl.
*H01L 33/00* (2010.01)

(52) U.S. Cl.
USPC .................................... 257/88; 257/E33.053

(58) Field of Classification Search ..................... 257/88, 257/E33.053
See application file for complete search history.

(56) References Cited

U.S. PATENT DOCUMENTS

| | | | |
|---|---|---|---|
| 7,105,855 B2 * | 9/2006 | Winters | 257/40 |
| 7,132,694 B2 * | 11/2006 | Mochizuki | 257/91 |
| 7,834,557 B2 * | 11/2010 | Kim | 315/169.3 |
| 2003/0067666 A1 | 4/2003 | Kawai | |
| 2003/0219934 A1 * | 11/2003 | Furusawa | 438/158 |
| 2006/0208266 A1 * | 9/2006 | Yamamoto | 257/88 |

FOREIGN PATENT DOCUMENTS

JP 2003-140199 A 5/2003

OTHER PUBLICATIONS

Garnier, F. et al "All Polymer Field Effect Transistor realized by Printing Techniques." Science, vol. 265 (1994):pp. 1684-1686.*

* cited by examiner

*Primary Examiner* — Matthew W Such
*Assistant Examiner* — Monica D Harrison
(74) *Attorney, Agent, or Firm* — ALG Intellectual Property, LLC

(57) ABSTRACT

An active matrix substrate includes a substrate; a plurality of data lines provided on the substrate; a plurality of scanning lines provided to cross the data lines on the substrate when seen in a plan view; a thin film transistor that is electrically connected to one of the plurality of data lines and one of the plurality of scanning lines and has an organic semiconductor layer; a pixel electrode electrically connected to the thin film transistor; and a capacitive element electrically connected in parallel with the thin film transistor between the data line and the pixel electrode.

13 Claims, 14 Drawing Sheets

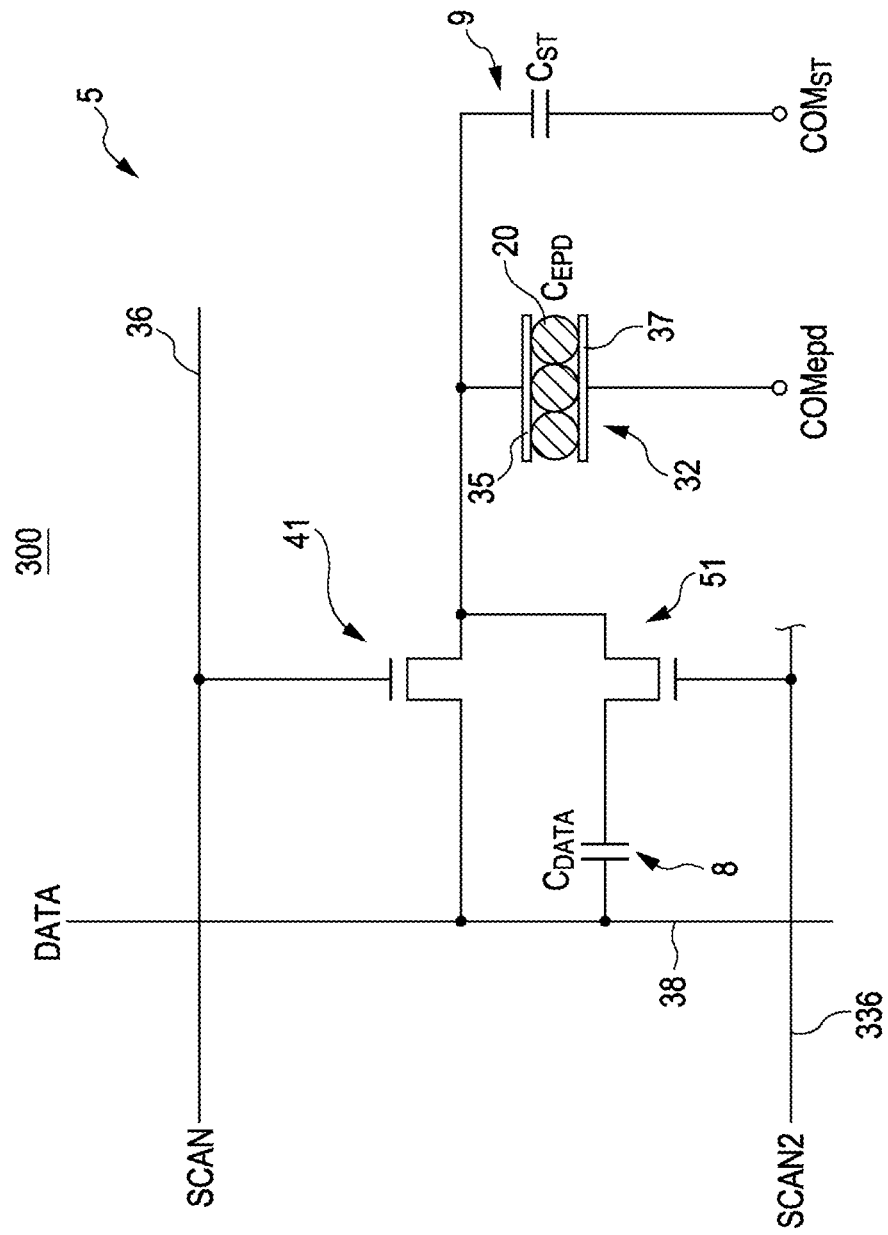

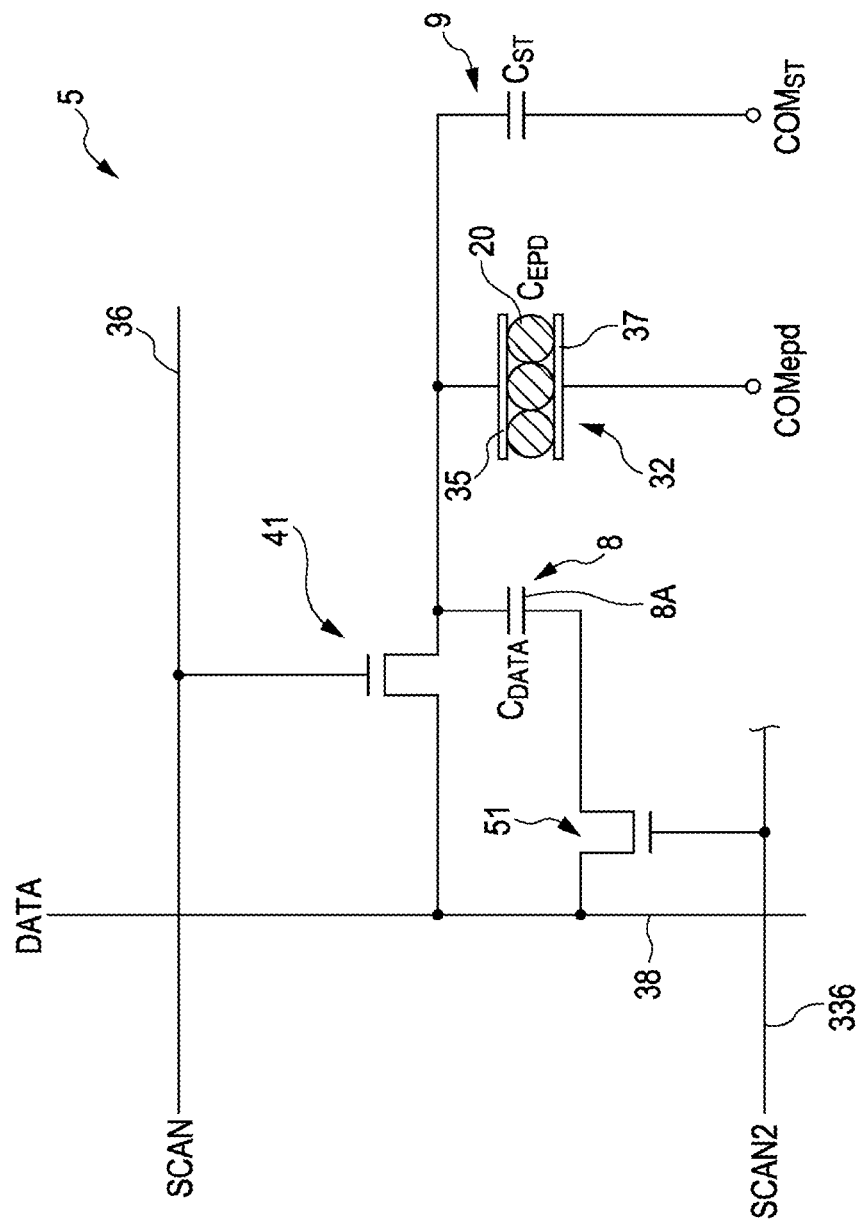

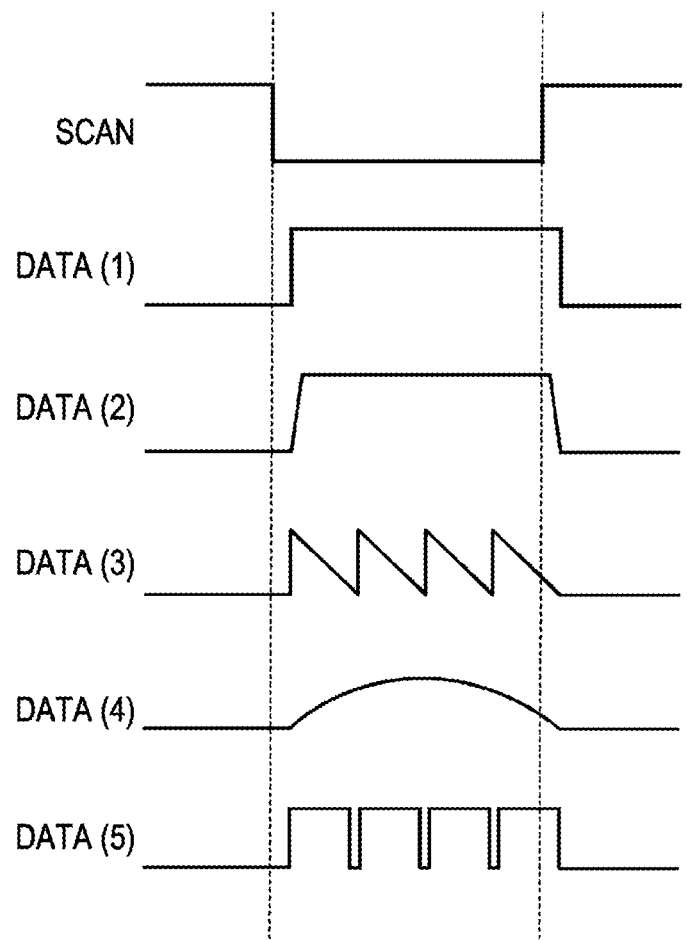

ACTIVE MATRIX SUBSTRATE, ELECTROPHORETIC DISPLAY APPARATUS, AND ELECTRONIC DEVICE

BACKGROUND

1. Technical Field

The present invention relates to an active matrix substrate, an electrophoretic display apparatus, and an electronic device.

2. Related Art

An organic transistor using an organic semiconductor layer is known as a transistor used in a switching element of an active matrix substrate or the like. Since such an organic transistor can be manufactured through a low-temperature process, a plastic substrate or film can be used as a base body. Therefore, a flexible and light-weight indestructible element can be obtained. Recently, organic transistors are being used as a switching element of the active matrix substrate.

Since the organic transistor can be manufactured through a simple method such as coating or printing using a liquid material, elements can be obtained in a short time period. Therefore, there is a significant merit that a process cost or a manufacturing equipment cost can be remarkably lowered. In addition, since the material properties of the organic material are easily changed by modifying its molecular structure, the organic transistor using the organic material can correspond to a variety of functions including functions that are hard to be implemented using an inorganic material. For example, the active matrix substrate using the organic transistor can be used in an electro-optical apparatus such as an electrophoretic apparatus disclosed in JP-A-2003-140199.

However, the switching speed of the switching element that uses the organic transistor is slower than that of the switching element that uses an inorganic transistor such as silicon, which makes it difficult to increase the driving speed of the active matrix substrate.

SUMMARY

An advantage of some aspects of the invention is that an active matrix substrate, an electrophoretic display apparatus, and an electronic device having a higher operation speed can be provided.

According to an aspect of the invention, there is provided an active matrix substrate including: a substrate; a plurality of data lines provided on the substrate; a plurality of scanning lines provided to cross the plurality of data lines on the substrate when seen in a plan view; a thin film transistor that has an organic semiconductor layer, the thin film transistor being electrically connected to one of the plurality of data lines and one of the plurality of scanning lines; a pixel electrode electrically connected to the thin film transistor; and a capacitive element electrically connected in parallel with the thin film transistor between the one of the plurality of data lines and the pixel electrode.

In this case, since the capacitive element is electrically connected in parallel with the thin film transistor between the data line and the pixel electrode, a voltage can be applied from the data line to the pixel electrode via the capacitive element. Therefore, when a predetermined voltage is applied to the pixel electrode via the thin film transistor having an organic semiconductor layer, the time period that elapses before the voltage of the pixel electrode increases can be reduced. This allows a driving speed to increase.

It is preferable that the active matrix substrate further includes a second transistor that is arranged between the capacitive element and the pixel electrode and switches electric connection between the capacitive element and the pixel electrode.

In this case, since the capacitive element can be switched by the second transistor, timing for applying the voltage to the pixel electrode via the capacitive element can be controlled. This allows more accurate driving to be implemented.

It is preferable that the active matrix substrate further includes a second transistor that is arranged between the capacitive element and the data line and switches electric connection between the capacitive element and the data line.

In this case, since the capacitive element can be switched by the second transistor, timing for applying a voltage to the pixel electrode via the capacitive element can be controlled. This allows more accurate driving to be implemented.

It is preferable that the thin film transistor and the second transistor are connected to the one of the plurality of scanning lines.

In this case, since the thin film transistor and the second transistor are connected to the one of the plurality of scanning lines, the switching of the thin film transistor and the switching of the second transistor can be synchronized. This allows more accurate driving to be implemented.

It is preferable that the active matrix substrate further includes a second scanning line provided along the one of the plurality of scanning lines, and the second transistor is connected to the second scanning line.

In this case, since the thin film transistor and the second transistor are connected to different scanning lines, respectively, the switching of the thin film transistor and the switching of the second transistor can be independently controlled. This allows a wide variety of driving types to be implemented.

It is preferable that the capacitive element has a capacitive electrode partially overlapping with the data line in the active matrix substrate.

In this case, since the capacitive electrode included in the capacitive element partially overlaps with the data line, the data line and the capacitive element can be connected to each other using a simple structure. In addition, the connection distance between the data line and the capacitive element can be shortened.

It is preferable that the capacitive element has a capacitive electrode provided in the same layer as that of the scanning line in the active matrix substrate.

In this case, since the capacitive electrode included in the capacitive element is provided in the same layer as that of the scanning line, the capacitive electrode and the scanning line can be provided through an identical process.

It is preferable that the active matrix substrate further includes a storage capacitor connected to the pixel electrode, and the capacitive element has a capacitive electrode provided in the same layer as that of a storage capacitive electrode included in the storage capacitor.

In this case, since the capacitive electrode included in the capacitive element is provided in the same layer as that of the storage capacitive electrode included in the storage capacitor, the capacitive electrode and the storage capacitive electrode can be provided through an identical process.

According to another aspect of the invention, there is provided an electrophoretic display apparatus including: the active matrix substrate; an opposite substrate that is disposed to face a surface, having the pixel electrode, of the active matrix substrate and has a common electrode on a surface facing the active matrix substrate; and an electrophoretic layer interposed between the active matrix substrate and the opposite substrate.

In this case, since the active matrix substrate capable of providing high speed driving is used, it is possible to obtain an electrophoretic display apparatus capable of implementing display rewriting at a high speed.

It is preferable that any one of rectangular, trapezoidal, triangular, sinusoidal and square waveforms or a waveform that can be obtained by combining them is applied to the pixel electrode via the data line when the thin film transistor is turned on.

In this case, since any one of rectangular, trapezoidal, triangular, sinusoidal and square waveforms or a waveform that can be obtained by combining them is applied to the pixel electrode via the data line when the thin film transistor is turned on, the electric potential of the pixel electrode can be rapidly controlled.

According to still another aspect of the invention, there is provided an electronic device comprising the aforementioned electrophoretic display apparatus.

In this case, since the electrophoretic display apparatus capable of implementing display rewriting at a high speed is installed, it is possible to obtain an electronic device including a display unit having a high display quality.

BRIEF DESCRIPTION OF THE DRAWINGS

The invention will be described with reference to the accompanying drawings, wherein like numbers reference like elements.

FIG. 11 is a circuit diagram illustrating a single pixel of an electrophoretic display apparatus according to a third embodiment of the invention.

FIG. 14 is a circuit diagram illustrating another structure of an electrophoretic display apparatus according to another aspect of the invention.

FIG. 15 is a driving waveform supplied to a data line.

DESCRIPTION OF EXEMPLARY EMBODIMENTS

First Embodiment

Figure 1:
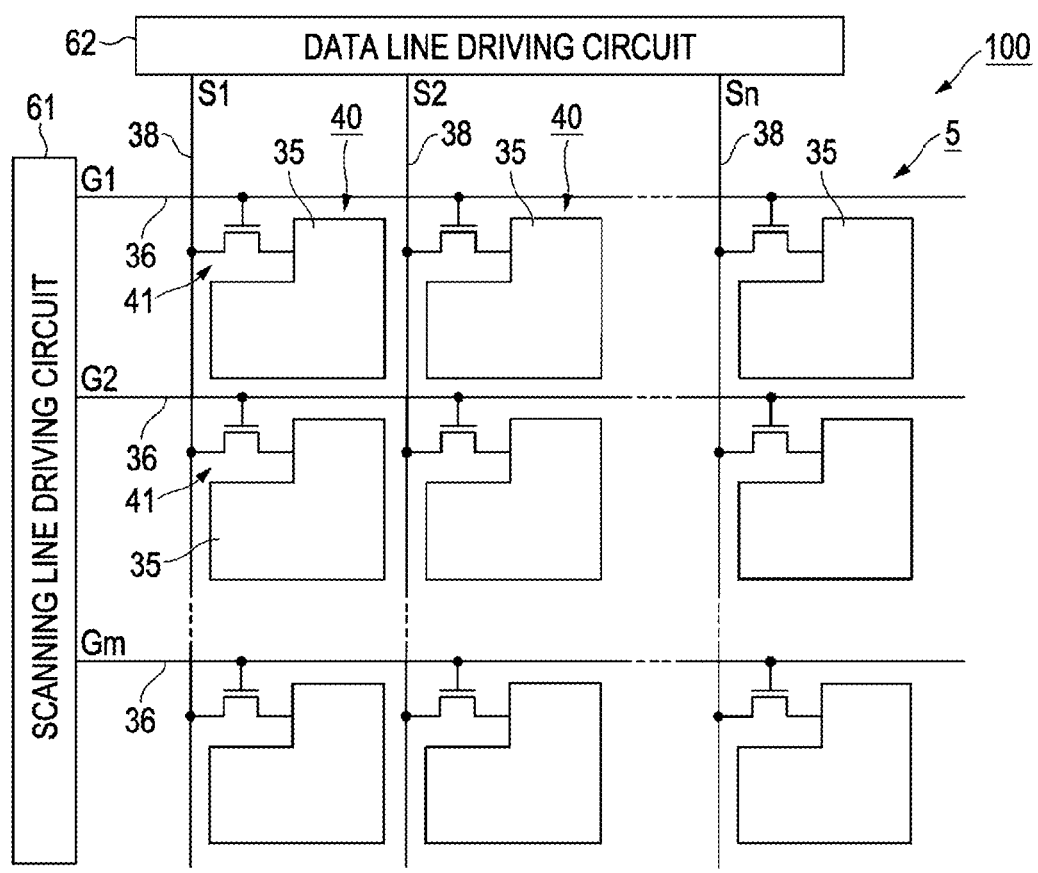
FIG. 1 is a schematic diagram illustrating an electrophoretic display apparatus according to a first embodiment of the invention.

Hereinafter, a first embodiment of the invention will be described with reference to the accompanying drawings. FIG. 1 is a schematic diagram illustrating an electrophoretic display apparatus 100 as an electro-optical apparatus according to a first embodiment of the invention.

The electrophoretic display apparatus 100 includes a display unit 5 having a plurality of pixels 40 arranged in a matrix shape. A scanning line driving circuit 61 and a data line driving circuit 62 are disposed in the circumference of the display unit 5. The display unit 5 also includes a plurality of scanning lines 36 extending from the scanning line driving circuit 61 and a plurality of data lines 38 extending from the data line driving circuit 62. Pixels 40 are provided in the intersections between the scanning lines 36 and the data lines 38. A pixel 40 has a selection transistor 41 (e.g. a thin film transistor) connected to the scanning line 36 and the data line 38 and a pixel electrode 35 connected to the selection transistor 41.

The scanning line driving circuit 61 is connected to each pixel 40 via m scanning lines 36 (G1, G2, . . . , Gm). The scanning lines 36 are selected in order from the first row to the m-th row to supply a selection signal for regulating ON-timing of the selection transistor 41 of the pixel 40 via the selected scanning line 36.

The data line driving circuit 62 is connected to each pixel 40 via n data lines 38 (S1, S2, . . . , Sn) to supply an image signal for regulating pixel data to each pixel 40.

FIG. 2 is a partial cross-sectional view of a pixel 40 provided in the display unit 5 of an electrophoretic display apparatus 100. In the electrophoretic display apparatus 100, an electrophoretic element 32 obtained by arranging a plurality of micro-capsules 20 is interposed between the element substrate 30 and the opposite substrate 31.

In the display unit 5, a pixel electrode 35, a scanning line 36, a data line 38, and a selection transistor 41 are provided on the electrophoretic element 32 side of the element substrate 30.

The element substrate 30 is made of glass, plastic, or the like. Since the element substrate 30 is disposed on the opposite side to the image display surface, it need not be transparent. Particularly, according to a first embodiment of the invention, since the selection transistor 41 is an organic transistor which will be described later, an inexpensive, light-weight, and highly flexible plastic substrate can be used.

The pixel electrode 35 is used to apply a driving voltage to the electrophoretic element 32 and formed by successively plating nickel and gold on a Cu (copper) film or by using Al, ITO (indium tin oxide), or the like. Otherwise, Cr, Ta, Mo, Nb, Ag, Pt, Pd, In, Nd, alloy of these materials, conductive oxide such as $InO_2$ or $SnO_2$, conductive polymer such as polyaniline, polypyrrole, polythiophene, or polyacetylene, materials obtained by adding, to the conductive polymer, impurities including acid such as hydrochloric acid, sulfuric acid, and sulfonic acid, Lewis acid such as $PF_6$, $AsF_5$, and $FeCl_3$, halogen atoms such as iodine, metallic atoms such as sodium and potassium, or the like, conductive composite materials obtained by dispersing carbon black or metal particles, or the like may be used. The scanning line 36 and the data line 38 may be formed of the same material as that of the pixel electrode 35.

The selection transistor 41 has a semiconductor layer 41A, a gate insulation film 41B, a source electrode 38S, a drain electrode 35D, and a gate electrode 41G.

The source electrode 38S and the drain electrode 35D are formed on the element substrate 30 with a constant interval.

The semiconductor layer 41A is an organic semiconductor layer including an organic semiconductor material. The semiconductor layer 41A is formed in an area including a gap between the source electrode 38S and the drain electrode 35D on the element substrate 30 so that it partially sits on the source electrode 38S and the drain electrode 35D.

For example, the organic semiconductor material may include a polymeric organic semiconductor material such as poly(3-alkylthiophene), poly(3-hexylthiophene) (i.e., P3HT), poly(3-octylthiophene), poly(2,5-thienylene vinylene) (i.e., PTV), poly(p-phenylene vinylene)(i.e., PPV), poly(9,9-dioctylfluorene)(i.e., PFO), poly(9,9-dioctylfluorene-co-bis-N,N'-(4-methoxyphenyl)-bis-N,N'-phenyl-1,4-phenylenediamine)(i.e., PFMO), poly(9,9-dioctylfluorene-co-benzothiadiazole)(i.e., BT), a fluorene-triarylamine copolymer, a triallylamine-based polymer, and a fluorene-bithiophene copolymer such as poly(9,9-dioctylfluorene-co-dithiophene)(i.e., F8T2), C60, metal phthalocyanine, their substituted derivatives, an acene molecular material such as anthracene, tetracene, pentacene, and hexacene, an α-oligothiophenes, thiophenes, specifically, low-molecular organic semiconductor such as quarterthiophene (4T), sexithiophene (6T), octathiophene, or a combination of them.

A method of forming the organic semiconductor film may include, vacuum evaporation, molecular beam epitaxial growth, chemical vapor deposition (CVD), sputtering, plasma polymerization, electro-polymerization, chemical polymerization, ion plating, spin coating, casting, pulling, a Langmuir-Blodgett method, spraying, an ink jet method, roll coating, bar coating, dispensing, silk screening, or dip coating, but is not limited thereto. For example, a semiconductor layer 41A having a partially different thickness can be formed by depositing a film after combining a mask having patterned holes on the element substrate 30 or by partially etching an organic semiconductor layer that has been uniformly deposited. Among these methods, a method of depositing the semiconductor layer from a solution material using the ink jet method or the dispensing method is preferable because the film thickness can be most conveniently controlled.

The gate insulation film 41B is selectively formed on a planar area which covers the semiconductor layer 41A. A material for forming the gate insulation film 41B includes any insulation material, and the type thereof is not particularly limited. While the insulation material may be organic or inorganic, the organic insulation material is preferably adopted because it is considered that the organic insulation film can easily form a satisfactory interface with the organic semiconductor layer. In general, the gate insulation film 41B that can obtain satisfactory electric characteristics may include polyvinyl alcohol, polyethylene, polypropylene, polybutylene, polystyrene, poly methyl methacrylate, polyimide, polyvinyl phenol, polycarbonate, para-xylylene film, or a combination of them.

The gate electrode 41G is formed to face a channel region (i.e., a gap between the source electrode 38S and the drain electrode 35D) of the semiconductor layer 41A with the gate insulation film 41B being interposed. According to a first embodiment of the invention, the gate electrode 41G is formed by partially using the scanning line 36.

The gate electrode 41G (the scanning line 36) may be formed by etching the conductive film of the aforementioned material. Alternatively, the gate electrode 41G may be formed by depositing a conductive film on the element substrate 30 using a metal thru-mask which has holes having a predetermined shape. Alternatively, the gate electrode 41G may be formed by selectively applying a solution containing conductive particles such as metallic micro-particles or graphite using an ink jet method or the like.

Focusing on the cross-sectional structure of the electrophoretic display apparatus 100 in the pixel 40, a selection transistor 41 is formed on the element substrate 30, and an insulation layer 34 made of silicon oxide, acrylic resin, or epoxy resin is formed to cover the selection transistor 41. Then, a pixel electrode 35 is formed on the insulation layer 34. The pixel electrode 35 is connected to the drain region 41D of the selection transistor 41 via a contact hole 34a reaching the drain electrode 35D through the insulation layer 34.

In this construction, since only the pixel electrode 35 is disposed on the surface of the element substrate 30, the aperture ratio of the pixel 40 increases. Since the surface of the element substrate 30 is nearly flattened, adhesion between the electrophoretic element 32 and the element substrate 30 becomes excellent. In addition, since electric fields generated around the selection transistor 41 during the driving thereof can be attenuated by the insulation layer 34, display quality degradation due to a leakage electric field is avoided.

Meanwhile, the electrophoretic element 32 side of the opposite substrate 31 includes a common electrode 37 (i.e., a second electrode) having a planar shape to face a plurality of pixel electrodes 35. The electrophoretic element 32 is provided on the common electrode 37.

Since the opposite substrate 31 made of glass, plastic, or the like is disposed in the image display side, a transparent substrate is employed. The common electrode 37 is used to apply a voltage to the electrophoretic element 32 together with the pixel electrode 35. The common electrode 37 is a transparent electrode formed of MgAg (magnesium silver), ITO (indium tin oxide), IZO (indium zinc oxide), or the like.

The electrophoretic element 32 is interposed between the pixel electrode 35 and the common electrode 37. The electrophoretic element 32 may be constructed as an electrophoretic sheet which is previously formed in the opposite substrate 31 side and further includes an adhesive for attaching the electrophoretic element 32 to the element substrate 30. The adhesive may fill the gap between micro-capsules 20 or be formed as an adhesive layer which covers the electrophoretic element 32 provided on the opposite substrate 31.

Figure 2A:
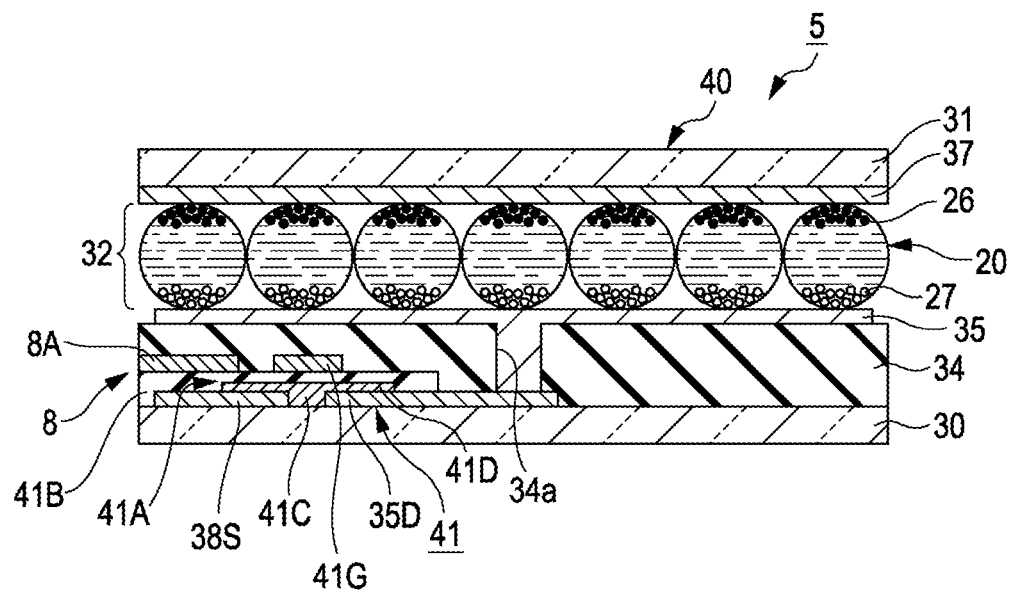
FIG. 2A is a partial cross-sectional view of a single pixel of an electrophoretic display apparatus.
Figure 2B:
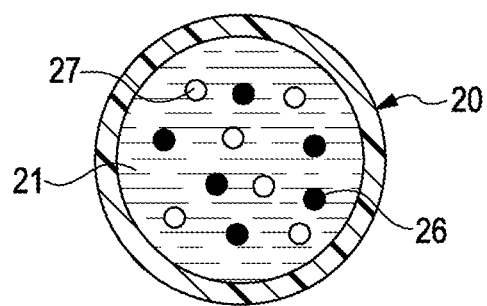
FIG. 2B is a cross-sectional view illustrating a microcapsule.

FIG. 2B is a cross-sectional view illustrating the micro-capsule 20. The micro-capsule 20 has a diameter of, for example, about 50 μm and is a globular body obtained by internally encapsulating a dispersing medium 21, a plurality of white (electrophoretic) particles 27, and a plurality of black (electrophoretic) particles 26. The micro-capsule 20 is interposed between the common electrode 37 and the pixel electrode 35 as shown in FIG. 2A. A single micro-capsule 20 or a plurality of micro-capsules 20 may be disposed in a single pixel 40.

A shell (e.g., wall film) of the micro-capsule 20 is formed of acrylic resin such as poly methyl methacrylate and poly ethyl methacrylate, urea resin, translucent polymeric resin such as Arabic gum, or the like.

The dispersing medium 21 is a liquid for dispersing the white and black particles 27 and 26 within the micro-capsule 20. The dispersing medium 21 may include water, an alcoholic solvent (such as methanol, ethanol, isopropanol, butanol, octanol, and methyl sellosolve), esters (such as ethyl acetate and butyl acetate), ketones (such as acetone, methyl ethyl ketone, and methyl isobutyl ketone), aliphatic hydrocarbon (such as pentane, hexane, and octane), alicyclic hydrocarbon (such as cyclo-hexane, and methyl cyclo-hexane), aromatic hydrocarbon (such as benzene, toluene, and benzenes having a long-chain alkyl group (such as xylene, hexyl benzene, heptyl benzene, octyl benzene, nonyl benzene, decyl benzene, undecyl benzene, dodecyl benzene, tridecyl benzene, and tetradecyl benzene)), halogenated hydrocarbon (such as methylene chloride, chloroform, carbon tetrachloride, and 1,2-dichloroethane), carboxylate, or other petroleum materials. These materials may be used alone or as a mixture. A surface active agent may be added to the dispersing medium 21.

The white particles 27 are, for example, particles (polymeric molecules or colloids) made of white pigments such as titanium dioxide, zinc flower, and antimony trioxide, and, for example, negatively charged. The black particles 26 are, for example, particles (polymeric molecules or colloids) made of black pigments such as aniline black and carbon black, and, for example, positively charged.

A charge controlling agent such as an electrolyte, a surface active agent, metal soap, resin, gum, petroleum, varnish, and compound, a dispersing agent such as a titanium-based coupling agent, an aluminum-based coupling agent, and a silane-based coupling agent, a lubricant agent, and a stabilizing agent may be added to these pigments as necessary.

Instead of the black and white particles 26 and 27, other color pigments such as red, green, and blue pigments may be used. In this construction, red, green, and blue colors can be displayed on the display unit 5.

Figure 3:
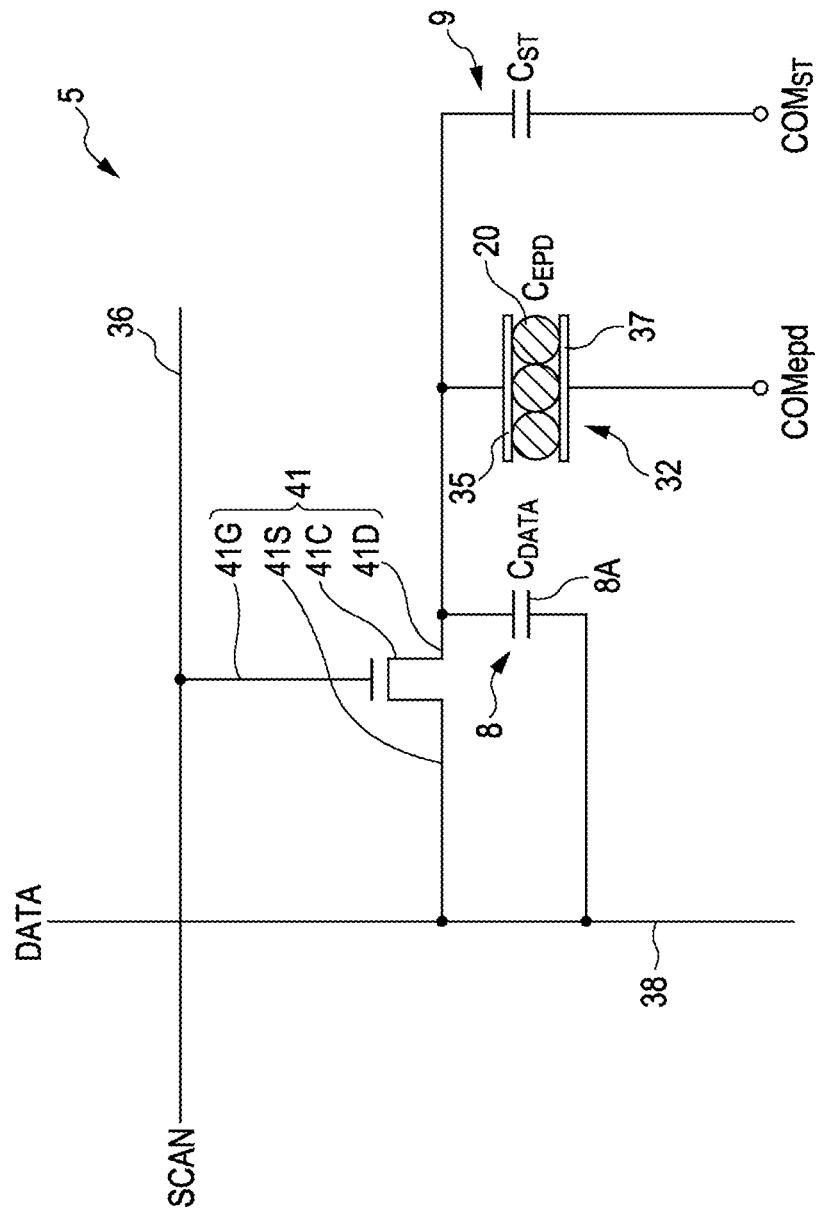
FIG. 3 is a circuit diagram illustrating a pixel.

FIG. 3 illustrates circuitry of a single pixel of the display unit 5. Referring to FIG. 3, the electrophoretic element 32 is represented as an electrostatic capacitor $C_{EPD}$. The pixel electrode 35 is connected to the data line 38 via the selection transistor 41. The common electrode 37 is connected to a power supply that can set a predetermined electric potential.

The selection transistor 41 includes a semiconductor layer 41A having a channel region 41C, a source region 41S, and a drain region 41D, and a gate electrode 41G disposed to face one surface of the semiconductor layer 41A. The gate electrode 41G is provided to overlap with the channel region 41C when seen in a plan view. A gate insulation layer is interposed between the gate electrode 41G and the organic semiconductor layer.

The gate electrode 41G of the selection transistor 41 is connected to the scanning line 36. The source region 41S is connected to the data line 38 via the source electrode 38S. The drain region 41D is connected to the pixel electrode 35 via the drain electrode 35D and the contact hole 34a. A data capacitor $C_{DATA}$ 8, which is a capacitive element as a characteristic element of a first embodiment of the invention, is connected between the data line 38 and the drain electrode 35D. Herein, the capacitive element provided between the data line 38 and the drain electrode 35D (i.e., between the data line 38 and the pixel electrode 35) is referred to as a data capacitor $C_{DATA}$ 8. The data capacitor 8 is electrically connected in parallel with the selection transistor 41 between the data line 38 and the pixel electrode 35. A storage capacitor $C_{ST}$ 9 is also connected to the drain electrode 35D. The storage capacitor 9 is connected in parallel with the electrophoretic element 32.

Figure 4:
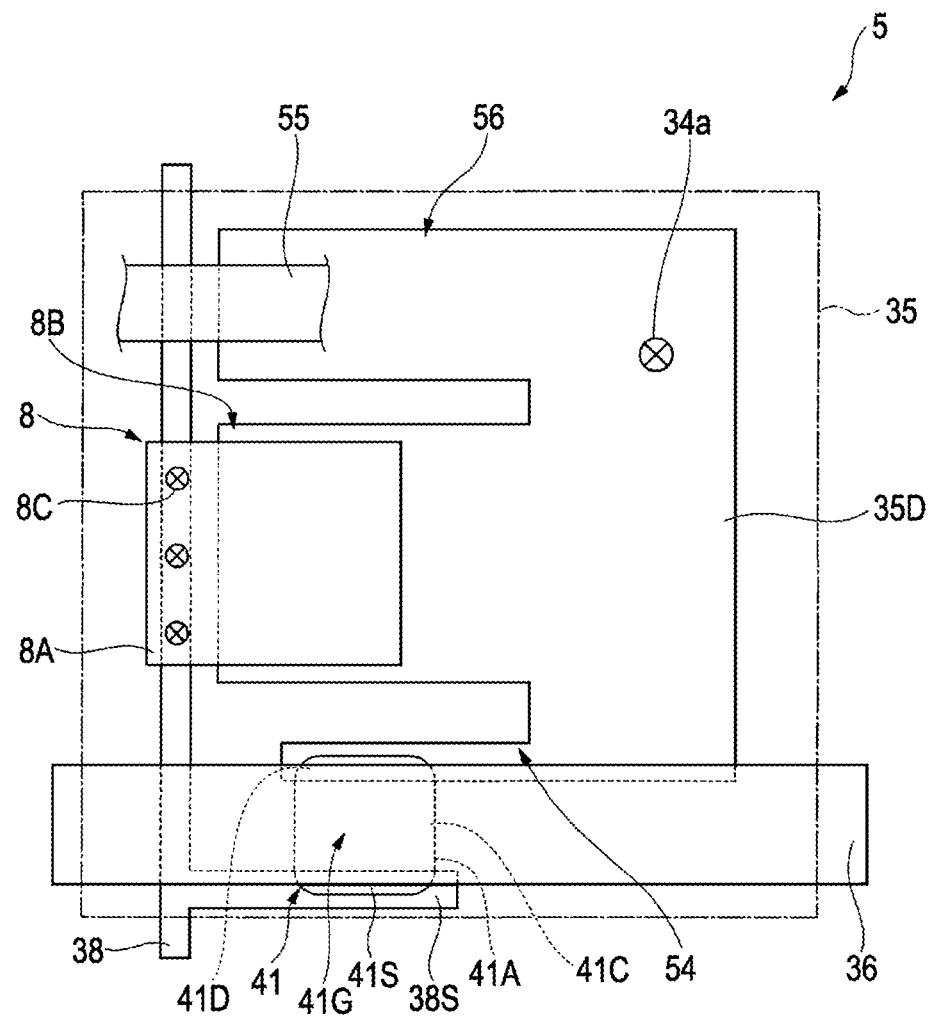
FIG. 4 is a plan view illustrating a pixel.

FIG. 4 is a plan view illustrating a construction of a single pixel 40 of the electrophoretic display apparatus 100 according a first embodiment of the invention.

Referring to FIG. 4, the pixel 40 has a three-layer wiring structure. Each layer is insulated by an insulation layer which is not shown in the drawings.

First of all, wiring lines provided in the circumference of the pixel 40 will be described. The scanning line 36 and the data line 38 are provided in the circumference of the pixel 40. These wiring lines are formed across a plurality of pixels 40. The scanning line 36 and the data line 38 are orthogonally intersected with each other, for example, in the bottom-left corner of the pixel 40 in the drawing. While the data line 38 is formed in the first layer, which is the lowermost layer among three layers, the scanning line 36 is formed in the second layer, which is an overlying layer of the data line 38. A common capacitive line $COM_{ST}$ 55 connected to the storage capacitor 9 is formed in the circumference of the pixel 40.

Subsequently, an internal construction of the pixel 40 will be described. In the first layer, which is the lowermost layer of the pixel 40, the source electrode 38S and the drain electrode 35D are provided. The source electrode 38S is electrically connected to the data line 38. According to a first embodiment of the invention, the source electrode 38S is branched from the data line 38. The drain electrode 35D has three branches for connection portions connected to the pixel electrode 35.

In the first layer, the semiconductor layer 41A is formed to cross both the source electrode 38S and the drain electrode 35D. In the semiconductor layer 41A, while the source region 41S sits on the source electrode 38S, the drain region 41D sits on a lower branch 54 in the drawing of the drain electrode 35D.

In the second layer of the pixel 40, a data capacitive electrode 8A as a capacitive electrode is provided. The data capacitive electrode 8A is provided in a location facing the vertically-center branch 8B in the drawing among three branches of the drain electrode 35D. The data capacitive electrode 8A and the branch 8B constitute the data capacitor 8. The data capacitor 8 is connected to the drain electrode 35D via the branch 8B.

The data capacitive electrode 8A is arranged to partially overlap with the data line 38 when seen in a plan view. A contact hole 8C is provided in a portion of the data capacitive electrode 8A overlapping with the data line 38 when seen in a plan view. The contact hole 8C electrically connects between the data line 38 and the data capacitive electrode 8A. A plurality of contact holes 8C are provided along the extension direction of the data line 38. According to a first embodiment of the invention, three contact holes 8C are provided along the data line 38. The number of the contact holes 8C is not particularly limited to three, but may be two or less as well as four or more.

According to a first embodiment of the invention, the data capacitive electrode 8A is overlaid on the data line 38, and the data capacitive electrode 8A overlaps with the data line 38 when seen in a plan view. The data capacitive electrode 8A and the data line 38 are connected to each other in the overlapping location. The data capacitive electrode 8A is provided in the same layer as that of the scanning line 36. For this reason, in a manufacturing process of the element substrate, the data capacitive electrode 8A and the scanning line 36 are formed at the same time. In addition, the data capacitive electrode 8A may be provided in the same layer as that of the storage capacitive electrode included in the storage capacitor 9. As a result, since the data capacitive electrode 8A is formed in the same layer as that of another wiring line or electrode, the manufacturing process of the element substrate can be simplified, and the number of layers of the elements on the element substrate can be reduced.

Subsequently, operation of the electrophoretic display apparatus constructed as described above will be described.

Figure 5A:
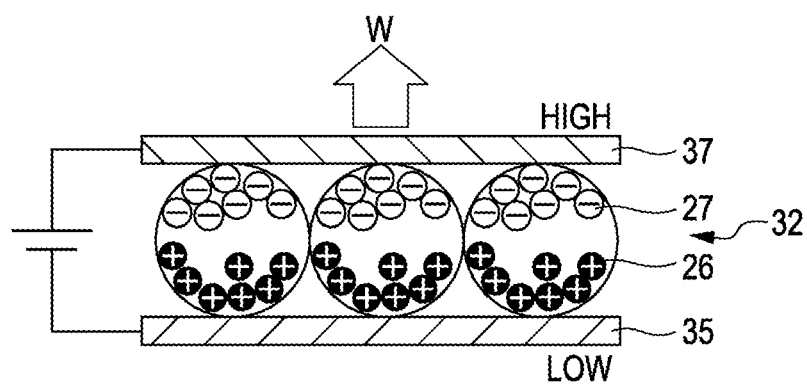
FIGS. 5A and 5B are diagrams illustrating the operation of an electrophoretic element.
Figure 5B:
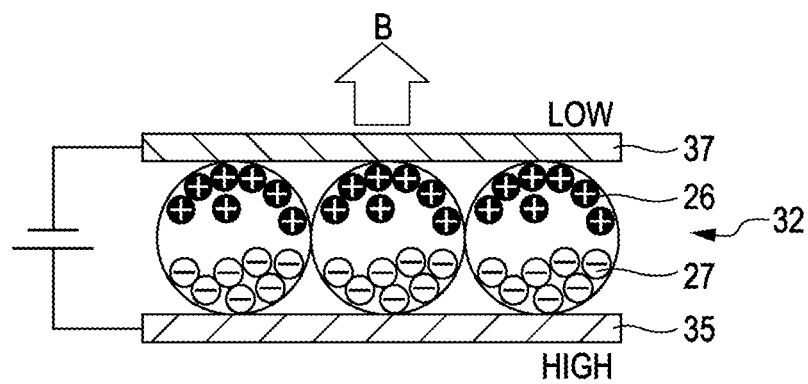

FIGS. 5A and 5B are diagrams illustrating the operation of the electrophoretic element. FIG. 5A illustrates an operation generated when the pixel 40 displays a white color, and FIG. 5B illustrates an operation generated when the pixel 40 displays a black color.

When the pixel 40 displays a white color as shown in FIG. 5A, the common electrode 37 retains a relatively high electric potential, and the pixel electrode 35 retains a relatively low electric potential. This allows the negatively-charged white particles 27 to be attracted to the common electrode 37, and the positively-charged black particles 26 to be attracted to the pixel electrode 35. As a result, when this pixel is seen from the common electrode 37 side corresponding to the display surface, it is perceived as a white color W.

When the pixel 40 displays a black color as shown in FIG. 5B, the common electrode 37 retains a relatively low electric potential, and the pixel electrode 35 retains a relatively high electric potential. This allows the positively-charged black particles 26 to be attracted to the common electrode 37, and the negatively-charged white particles 27 to be attracted to the pixel electrode 35. As a result, when this pixel is seen from the common electrode 37 side, it is perceived as a black color B.

Figure 6:
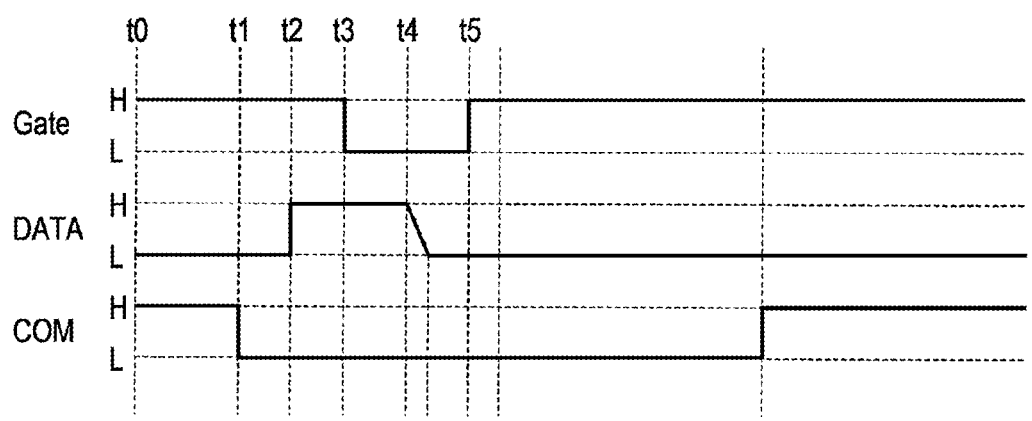
FIG. 6 is a timing chart illustrating a driving method according to a first embodiment of the invention.

FIG. 6 is a timing chart illustrating the case where a single pixel 40 displays a black color. A method of driving the electrophoretic display apparatus 100 will be described with reference to FIG. 6.

In order to display an image on the display unit 5, a driving voltage is applied to the electrophoretic element 32 (i.e., the micro-capsule 20) by applying a predetermined electric potential to the common electrode 37 and the pixel electrode 35 of a pixel 40 of an image display portion. At the start (at a timing t0) of the image display operation shown in FIG. 5, the electric potential Gate of the gate electrode 41G of the selection transistor 41 is a high level H (e.g., 40 V), and the electric potential DATA of the source electrode 38S is a low level L (e.g., 0 V which is a second electric potential). The electric potential COM of the common electrode 37 is a high level H (e.g., 40 V). It is noted that the pixel 40 has a high reflection state and displays a white color.

If the image display operation has been initiated, the electric potential COM of the common electrode 37 becomes a low level L (e.g., 0 V which is a second electric potential) at a timing t1. At a subsequent timing t2, the electric potential DATA of the source electrode 38S of the selection transistor 41 becomes a high level H (e.g., 40 V which is a first electric potential).

Subsequently, the electric potential Gate of the gate electrode 41G of the selection transistor 41 is set to a low level L (e.g., 0 V) at a timing t3 (an element driving step S1). Then, the selection transistor 41 is turned on, and the electric potential DATA of the source electrode 38S of the data line 38 (at a high level H which is a first electric potential) is input to the pixel electrode 35 via the selection transistor 41.

As a result, a voltage corresponding to a difference in the electric potential between the pixel electrode 35 (at a high level H which is a first electric potential) and the common electrode 37 (at a low level L which is a second electric potential) is applied to the electrophoretic element 32. This allows the black particles 26 of the electrophoretic element 32 to be attracted to the common electrode 37 side as shown in FIG. 3B. As a result, the pixel 40 has a low reflection state and displays a black color.

Then, at a timing t4, the electric potential DATA of the source electrode 38S is slowly changed from the high level H to the low level L with a constant gradient (as an accumulated charge removal step S2). It is noted that the electric potential Gate of the gate electrode 41G is a low level L, and the selection transistor 41 is remained in on state at this time. Therefore, the electrostatic capacitance $C_{EPD}$ of the electrophoretic element 32 is discharged by the selection transistor 41 with a constant gradient (i.e., a charge transfer rate) as shown in FIG. 5.

Then, at a timing t5 after the electric potential DATA of the source electrode 38S is changed to a low level L, the electric potential Gate of the gate electrode 41G of the selection transistor 41 is set to a high level H. As a result, the selection transistor 41 is turned off, and the image display operation in the pixel 40 is finished.

In general, it is known that a switching element using an organic transistor has a lower operation speed in comparison with a switching element using an inorganic transistor such as silicon due to the device characteristics thereof.

Figure 7A:
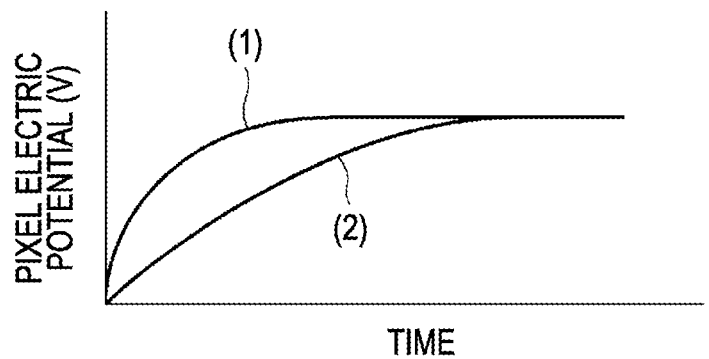
FIGS. 7A and 7B are graphs illustrating characteristics of an electrophoretic display apparatus according to a first embodiment of the invention.
Figure 7B:
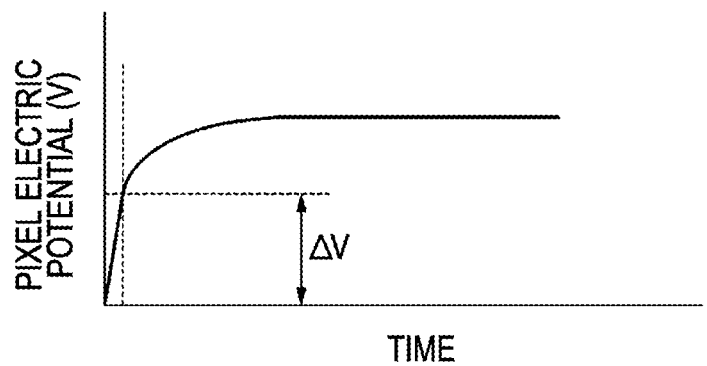

FIG. 7A is a graph for comparing characteristics between a case where a transistor formed of amorphous silicon is used and a case where an organic transistor is used as a selection transistor 41 in a conventional active matrix substrate. While the ordinate axis of the graph represents a pixel electric potential V, the abscissa axis of the graph represents time lapsed from the start of voltage application to the pixel 40. FIG. 7B is a graph illustrating characteristics in a case where an organic transistor is used as the selection transistor 41 in an active matrix substrate (the element substrate 30) according to a first embodiment of the invention. Similar to FIG. 7A, the ordinate axis and abscissa axis of FIG. 7B represent a pixel electric potential and time, respectively.

The graph (1) of FIG. 7A shows characteristics in a case where amorphous silicon is used in a conventional active matrix substrate. The graph (2) shows characteristics in a case where an organic transistor is used in a conventional active matrix substrate. As shown in the graphs (1) and (2), according to a conventional construction, the switching element obtained by using an organic transistor has a lower rising rate of the pixel electric potential in comparison with the switching element obtained by using amorphous silicon. An organic transistor has lower electron mobility in comparison with an inorganic transistor. It is contemplated that the difference of the rising rate of the pixel electric potential is generated because the electric current flowing through an organic transistor is smaller than the electric current flowing through an inorganic transistor.

Meanwhile, as shown in FIG. 7B, in the element substrate 30 according to a first embodiment of the invention, while the voltage signal of the data line 38 is supplied to the pixel 40 (i.e., the pixel electrode 35) via the selection transistor 41, the corresponding voltage signal is supplied to the pixel electrode 35 via the data capacitor 8. Since the voltage signal of the data line 38 is supplied to the pixel electrode 35 by capacitive coupling of the data capacitor 8, the electric potential of the pixel electrode 35 rises faster in comparison with a case where the voltage signal is supplied via an organic transistor only. For this reason, the time required to raise the electric potential of the pixel electrode 35 can be significantly reduced. In addition, the electric potential $\Delta V$ of the pixel electrode 35 raised by capacitive coupling can be represented by the following Equation 1. The parameter $V_{DATA}$ denotes a voltage value of the voltage signal supplied to the data line 38.

$$\Delta V = \frac{C_{DATA}}{C_{EPD} + C_{DATA} + C_{ST}} V_{DATA} \qquad \text{Equation 1}$$

In the element substrate 30 according to a first embodiment of the invention, the data capacitor 8 is directly connected between the data line 38 and the pixel electrode 35. Therefore, when a voltage signal is supplied to the data line 38, the voltage signal is also supplied to a portion of the pixel electrode 35 which has not been scanned by the scanning line 36.

Figure 8:
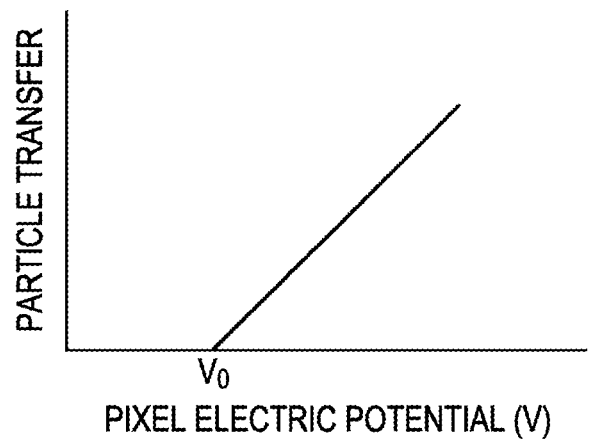
FIG. 8 is a graph illustrating the relationship between the transfer of the electrophoretic particles and a pixel electric potential.

FIG. 8 is a graph illustrating a relationship between the pixel electric potential and the transfer of the electrophoretic particles within an electrophoretic layer in the electrophoretic display apparatus. The ordinate axis represents the magnitude of transfer of the electrophoretic particle, and the abscissa axis represents the pixel electric potential.

Referring to FIG. 8, it is recognized that particles in the pixel 40 are transferred when the electric potential of the pixel 40 reaches a predetermined level ($V_0$: hereinafter, referred to as a particle transfer initiation voltage).

According to a first embodiment of the invention, particles are prohibited from transferring in the pixel 40 which has not been scanned, for example, by setting values of the data capacitance $C_{DATA}$, the storage capacitance $C_{ST}$, and the capacitance $C_{EPD}$ of the electrophoretic element 32 such that the electric potential $\Delta V$ of the pixel electrode 35 which is raised by capacitive coupling of the data capacitor 8 can be smaller than the particle transfer initiation voltage $V_0$.

According to a first embodiment of the invention, since the data capacitor 8 is provided between the pixel electrode 35 and the data line 38 corresponding to the pixel electrode 35, a voltage can be applied from the data line 38 via the data capacitor 8 to the pixel electrode 35. Therefore, when a predetermined voltage is applied to the pixel electrode 35 via the selection transistor 41 having a semiconductor layer 41A, the time that elapses before the voltage of the pixel electrode 35 rises can be reduced. This enables high speed driving.

Second Embodiment

Hereinafter, a second embodiment of the invention will be described. Similar to a first embodiment, each element will be appropriately scaled to a perceivable size in the following drawings. Like reference numerals denote like elements throughout first and second embodiments, and their description will be omitted. Since, according to a second embodiment of the invention, circuitry of the pixel 40 is different from that of a first embodiment, the following description will be focused on this circuitry.

Figure 9:
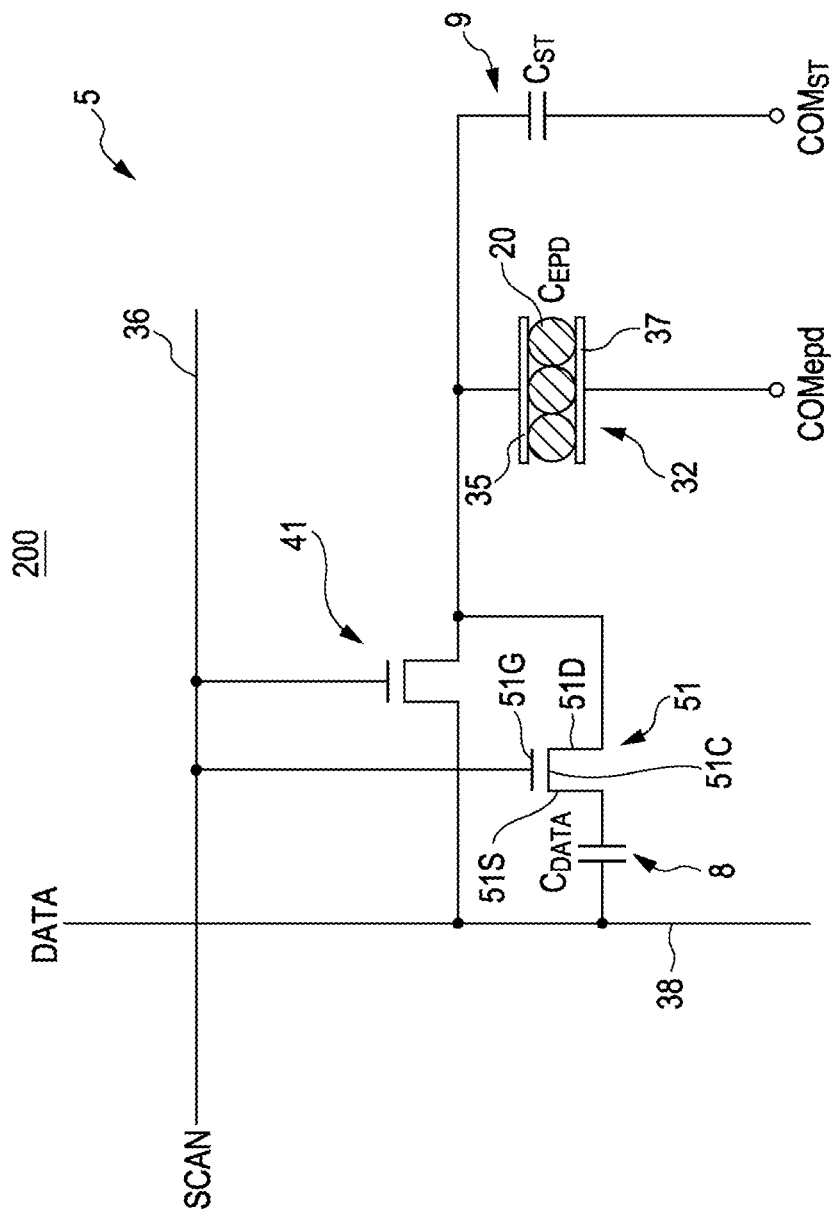
FIG. 9 is a circuit diagram illustrating a single pixel of an electrophoretic display apparatus according a second embodiment of the invention.
Figure 10:
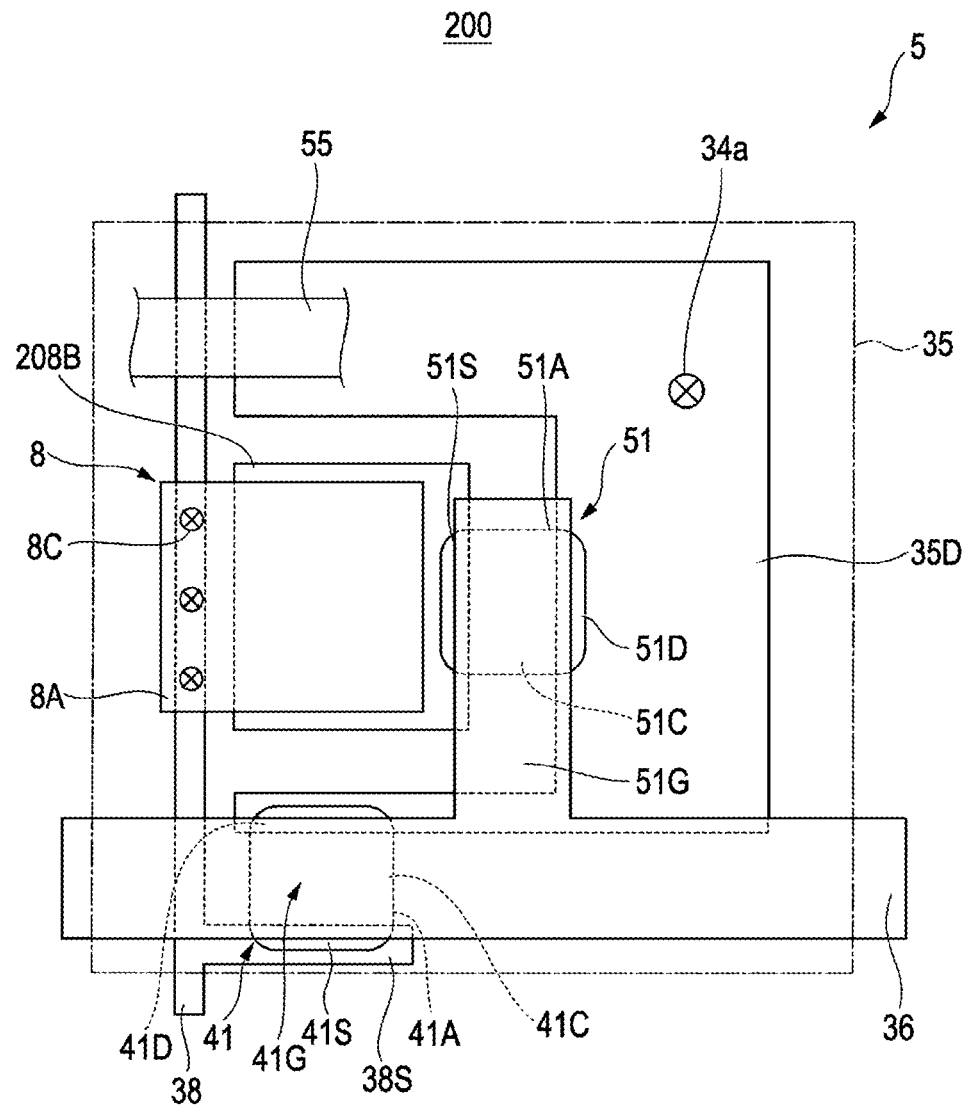
FIG. 10 is a plan view illustrating a single pixel of an electrophoretic display apparatus according to a second embodiment of the invention.

FIG. 9 is a circuit diagram illustrating circuitry of a single pixel 40 of an electrophoretic display apparatus 200 according to a second embodiment of the invention. FIG. 10 is a plan view illustrating a single pixel 40 of an electrophoretic display apparatus 200.

Referring to FIGS. 9 and 10, according to a second embodiment of the invention, a second selection transistor 51 is provided between the data capacitor 8 and the pixel electrode 35. The second selection transistor 51 includes a semiconductor layer 51A and a gate electrode 51G. The gate electrode 51G is connected to, for example, the scanning line 36. The selection transistor 41 and the second selection transistor 51 are connected to the scanning line 36 which is common.

The semiconductor layer 51A is made of an inorganic semiconductor such as amorphous silicon and has a channel region 51C, a source region 51S, and the drain region 51D. As shown in FIG. 10, the semiconductor layer 51A is disposed to overlap with the gate electrode 51G branched from the scanning line 36 when seen in a plan view. The semiconductor layer 51A is provided in the same layer as that of the semiconductor layer 41A included in the selection transistor 41.

The data capacitor 8 includes data capacitive electrodes 8A and 208B. The data capacitive electrode 8A is arranged similar to that of a first embodiment. According to a second embodiment of the invention, the data capacitive electrode 208B is connected to the drain electrode 35D via the semiconductor layer 51A.

The source region 51S is formed in the left side of the semiconductor layer 51A in FIG. 10. The semiconductor layer 51A is formed such that the source region 51S sits on the data capacitive electrode 208B. The drain region 51D is formed in the right side of the semiconductor layer 51A in FIG. 10. The semiconductor layer 51A is formed such that the drain region 51D sits on the drain electrode 35D. The channel region 51S corresponds to a portion extending between the source region 51C and the drain region 51D and overlaps with the gate electrode 51G when seen in a plan view.

As described above, in the electrophoretic display apparatus 200 according to a second embodiment of the invention, since the data capacitor 8 can be switched by the second selection transistor 51, a timing for applying a voltage to the pixel electrode 35 can be controlled by the data capacitor 8. As a result, more accurate driving can be implemented.

Third Embodiment

Hereinafter, a third embodiment of the invention will be described. Similar to a first embodiment, each element will be appropriately scaled to a perceivable size in the following drawings. Like reference numerals denote like elements throughout first and third embodiments, and their description will be omitted. Since, according to a third embodiment of the invention, circuitry of the pixel 40 is different from that of a first embodiment, the following description will be focused on this circuitry.

FIG. 11 is a circuit diagram illustrating circuitry of a single pixel 40 of an electrophoretic display apparatus 300 according to a third embodiment of the invention. According to a third embodiment of the invention, the gate electrode 51G of the second selection transistor 51 is not connected to the scanning line 36, but connected to a second scanning line 336 which is separately provided. Therefore, the selection transistor 41 and the second selection transistor 51 are controlled by different scanning lines 36 and 336, respectively. Other elements are similar to those of the second embodiment.

In the construction of FIG. 11, the scanning signal can be supplied to the second scanning line 336 independently from the scanning line 36. For this construction, for example, a separate driving circuit other than the scanning line driving circuit 61 may be provided to connect the second scanning line 336 to the corresponding driving circuit.

According to a third embodiment of the invention, since the selection transistor 41 and the second selection transistor 51 are connected to different scanning lines 36 and 336, respectively, switching of the selection transistor 41 and switching of the second selection transistor 51 can be independently controlled. This enables a wide variety of driving types to be implemented.

Fourth Embodiment

Hereinafter, a fourth embodiment of the invention will be described. A fourth embodiment of the invention will be described for a case where the electrophoretic display apparatuses 100 according to the aforementioned embodiments are applied to an electronic device.

Figure 12A:
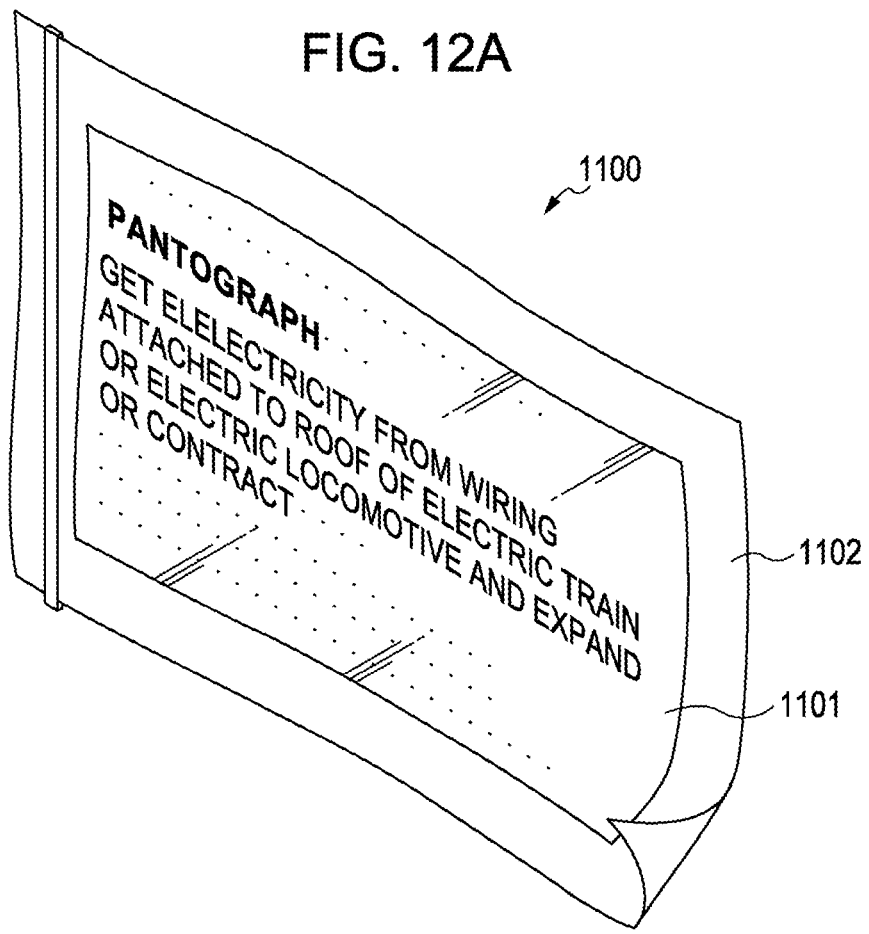
FIGS. 12A and 12B are diagrams illustrating a structure of an electronic device according to a fourth embodiment of the invention.

FIG. 12A is a perspective diagram illustrating an electronic paper 1100. The electronic paper 1100 is equipped with the electrophoretic display apparatuses 100, 200, and 300 of the aforementioned embodiments in a display area 1101. The electronic paper 1100 is flexible and includes a mainframe 1102 made of a rewritable sheet having texture and ductility like conventional paper.

Figure 12B:
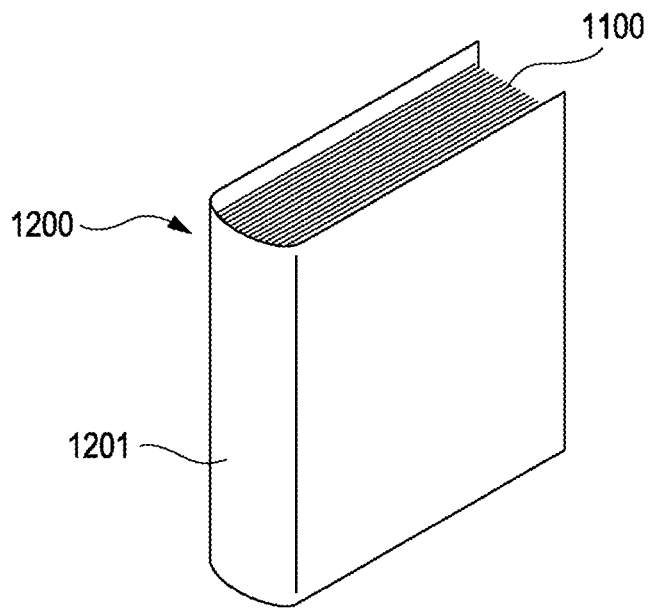

FIG. 12B is a perspective diagram illustrating an electronic note 1200. In the electronic note 1200, some pieces of electronic paper 1100 are bound together and interposed with a cover 1201. The cover 1201 includes, for example, a display data input unit, which is not shown in the drawing, for inputting display data transmitted from an external device. As a result, display contents can be modified or updated in response to the display data while some pieces of electronic paper remain to be bound together.

Since the aforementioned electronic paper 1100 and electronic note 1200 adopt the electrophoretic display apparatuses 100, 200, and 300 according to the invention, a display unit having an excellent image retaining characteristic and an outstanding display quality can be provided in an electronic device.

In addition, the aforementioned electronic device is intended to exemplify an electronic device according to the invention but is not intended to limit the technical scope of the invention. For example, the electrophoretic display apparatus according to the invention can be appropriately adopted in a display unit for other electronic devices such as mobile phones or mobile audio devices.

The technical scope of the invention is not limited to the aforementioned embodiments, but can be changed or modified without departing from the spirit of the invention.

Figure 13:
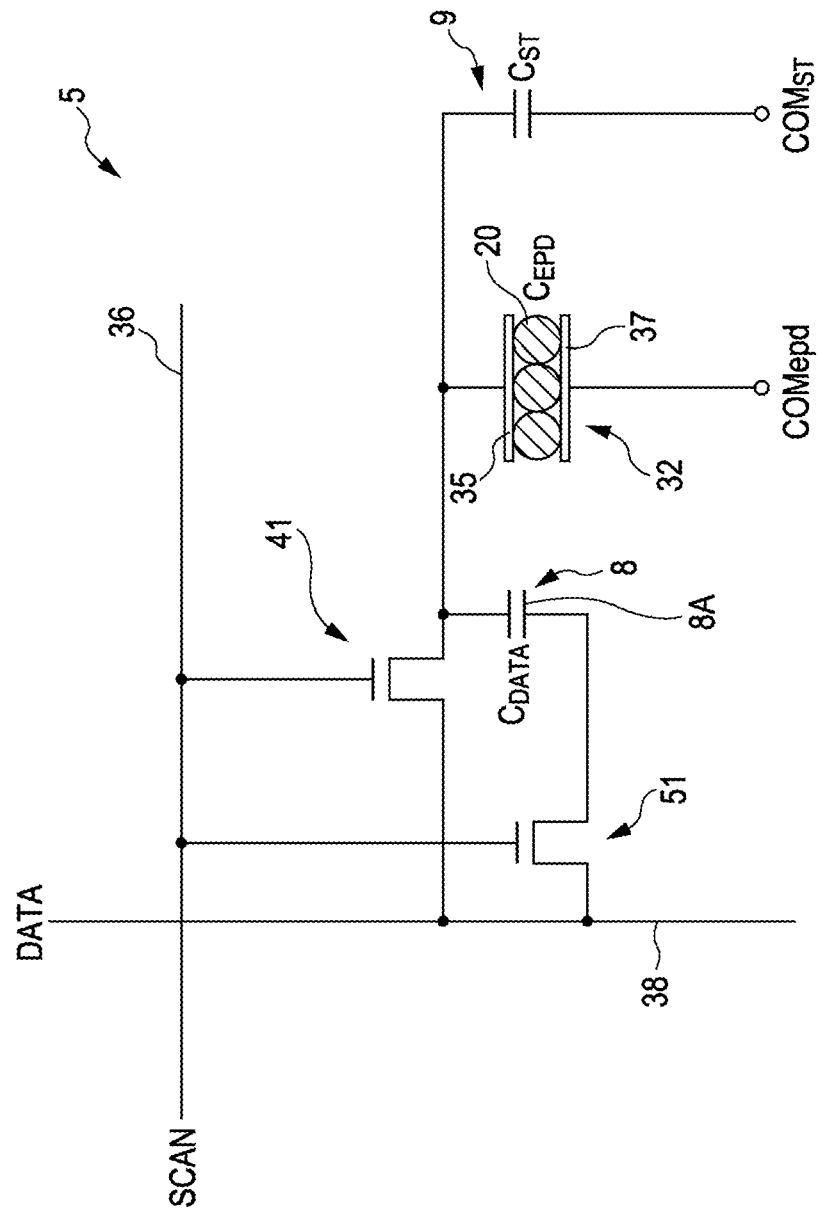
FIG. 13 is a circuit diagram illustrating another structure of an electrophoretic display apparatus according to another aspect of the invention.

While, in the aforementioned embodiments, the second selection transistor 51 is arranged between the data capacitor 8 and the pixel electrode 35, the invention is not limited thereto. FIG. 13 illustrates a construction in which the second selection transistor 51 is connected to the scanning line 36 which is common to the selection transistor 41. FIG. 14 illustrates a construction in which the second selection transistor 51 is connected to a different scanning line 336 from the scanning line 36 to which the selection transistor 41 is connected. As shown in FIGS. 13 and 14, the second selection transistor 51 may be disposed between the data line 38 and the data capacitor 8. In this construction, the data line 38 and the data capacitor 8 can be electrically separated while the second selection transistor is turned off. As a result, since capacitance connected to the data line 38 can be reduced, power consumption can be reduced when the data is written.

A driving waveform of the signal supplied to the data line 38 is not limited to those shown in FIG. 6. For example, as shown in FIG. 15, various waveforms such as (1) rectangular, (2) trapezoidal, (3) triangular, (4) sinusoidal and (5) square waveforms or a waveform that can be obtained by combining them may be used. Preferably, the waveform of the signal of the data line 38 is gradually changed from a high level to a low level rather than from a low level to a high level. As a result, a reduction rate of the pixel electric potential can be reduced, and display time can be lengthened as long as possible. The signal supplied to the data line 38 may have, for example, (3) a triangular waveform, and a voltage higher than the voltage supplied to the data line 38 may be temporarily applied to the pixel electrode 35.

While the embodiments have been described using a thin film transistor having a top-gate structure, the thin film transistor may have a different construction such as a bottom-gate structure.

The entire disclosure of Japanese Patent Application No. 2009-001533, filed Jan. 7, 2009 is expressly incorporated by reference herein.

What is claimed is:

1. An active matrix substrate comprising:
   a substrate;
   a plurality of data lines provided on the substrate;
   a plurality of scanning lines provided to cross the plurality of data lines on the substrate in a plan view;
   a plurality of pixels provided at intersections between the data lines and the scanning lines, each of the pixels including:
   a first selection transistor that has an organic semiconductor layer, a source region of the first selection transistor being electrically connected to one of the plurality of data lines, and a gate electrode of the first selection transistor being electrically connected to one of the plurality of scanning lines;
   a pixel electrode electrically connected to a drain region of the first selection transistor;
   a data capacitor electrically connected in parallel with the first selection transistor between the one of the plurality of data lines and the pixel electrode.

2. The active matrix substrate according to claim 1, further comprising a second transistor that is arranged between the data capacitor and the pixel electrode and switches electric connection between the data capacitor and the pixel electrode.

3. The active matrix substrate according to claim 2, wherein the first selection transistor and the second transistor are connected to the one of the plurality of scanning lines.

4. The active matrix substrate according to claim 2, further comprising a second scanning line provided along the one of the plurality of scanning lines, wherein the second transistor is connected to the second scanning line.

5. The active matrix substrate according to claim 1, further comprising a second transistor that is arranged between the data capacitor and the one of the plurality of data lines and switches electric connection between the data capacitor and the one of the plurality of data lines.

6. The active matrix substrate according to claim 1, wherein the data capacitor has a capacitive electrode partially overlapping with the data line.

7. The active matrix substrate according to claim 1, wherein the data capacitor has a capacitive electrode provided in the same layer as that of the scanning line.

8. The active matrix substrate according to claim 1, further comprising a storage capacitor connected to the pixel electrode, wherein the data capacitor has a capacitive electrode provided in the same layer as that of a storage capacitive electrode included in the storage capacitor.

9. An electrophoretic display apparatus comprising:
   the active matrix substrate according to claim 1;
   an opposite substrate that is disposed to face a surface, having the pixel electrode, of the active matrix substrate and has a common electrode on a surface facing the active matrix substrate; and
   an electrophoretic layer interposed between the active matrix substrate and the opposite substrate.

10. The electrophoretic display apparatus according to claim 9, wherein any one of rectangular, trapezoidal, triangular, sinusoidal and square waveforms or a waveform that can be obtained by combining them is applied to the pixel electrode via the one of the plurality of data lines when the thin film transistor is turned on.

11. An electronic device comprising the electrophoretic display apparatus according to claim 9.

12. The active matrix substrate according to claim 1, further comprising a storage capacitor electrically connected to the pixel electrode, wherein the data capacitor has a data capacitive electrode provided in the same layer as a storage capacitive electrode included in the storage capacitor.

13. An active matrix substrate comprising:
   a substrate;
   a plurality of data lines provided on the substrate;
   a plurality of scanning lines provided to cross the plurality of data lines on the substrate in a plan view;

a plurality of pixels provided at intersections between the data lines and the scanning lines, each of the pixels including:
- a first selection transistor that has an organic semiconductor layer, a source region of the first selection transistor being electrically connected to one of the plurality of data lines, and a gate electrode of the first selection transistor being electrically connected to one of the plurality of scanning lines;
- a pixel electrode electrically connected to a drain region of the first selection transistor;
- a data capacitor electrically connected in parallel with the first selection transistor between the one of the plurality of data lines and the pixel electrode; and
- a second selection transistor that is electrically connected in series to the data capacitor, the second selection transistor having an organic semiconductor layer and a gate electrode that is electrically connected to the one of the plurality of scanning lines.

* * * * *